(12) United States Patent
Choi

(10) Patent No.: US 8,685,203 B2
(45) Date of Patent: Apr. 1, 2014

(54) DRY ETCHER INCLUDING ETCHING DEVICE AND CLEANING DEVICE

(75) Inventor: Jae-Hyun Choi, Chungcheongnam-do (KR)

(73) Assignee: Semens Co., Ltd. (KR)

( * ) Notice: Subject to any disclaimer, the term of this patent is extended or adjusted under 35 U.S.C. 154(b) by 1568 days.

(21) Appl. No.: 11/807,743

(22) Filed: May 30, 2007

(65) Prior Publication Data

US 2008/0023140 A1 Jan. 31, 2008

(30) Foreign Application Priority Data

Jul. 31, 2006 (KR) ........................ 10-2006-0072327

(51) Int. Cl.
*C23F 1/00* (2006.01)
*B08B 3/12* (2006.01)

(52) U.S. Cl.
USPC ............... 156/345.32; 134/95.1; 134/129; 134/198; 134/902; 118/73

(58) Field of Classification Search
USPC ................... 156/345.29, 345.32; 118/73
See application file for complete search history.

(56) References Cited

U.S. PATENT DOCUMENTS

| | | | |
|---|---|---|---|
| 5,672,239 A * | 9/1997 | DeOrnellas ............... | 438/706 |
| 6,073,636 A * | 6/2000 | Kim et al. ................ | 134/1.3 |
| 6,155,200 A | 12/2000 | Horiike et al. | |
| 6,264,748 B1 | 7/2001 | Kuriki et al. | |
| 6,391,791 B1 | 5/2002 | Sasaki et al. | |
| 7,358,192 B2 | 4/2008 | Merry et al. | |
| 2003/0045131 A1 * | 3/2003 | Verbeke et al. ............... | 438/795 |
| 2004/0084416 A1 | 5/2004 | Lee et al. | |
| 2004/0104199 A1 * | 6/2004 | Uesugi et al. ................... | 216/83 |
| 2005/0223980 A1 * | 10/2005 | Awamura et al. ............. | 118/708 |
| 2006/0234503 A1 * | 10/2006 | Yamada et al. ............... | 438/667 |

FOREIGN PATENT DOCUMENTS

| | | | | |
|---|---|---|---|---|
| JP | 2005228938 A | | 8/2005 | |
| JP | 2007533139 T | | 11/2007 | |
| KR | 1999-013651 | | 2/1999 | |
| KR | 1999-023624 | | 3/1999 | |
| KR | 1020050094735 A | | 9/2005 | |
| KR | 1020060030592 | * | 4/2006 | ............... G02F 1/13 |
| KR | 1020060030592 A | | 4/2006 | |
| TW | 393591 B | | 6/2000 | |
| TW | M243778 U | | 9/2004 | |

OTHER PUBLICATIONS

Office Action from the Chinese Patent Office for the corresponding Chinese patent application No. 200710102093.9, issued Feb. 5, 2010.
Office Action from the Japanese Patent Office for the corresponding Japanese patent application No. 2007-115619, issued May 10, 2010.

(Continued)

*Primary Examiner* — Parviz Hassanzadeh
*Assistant Examiner* — Nathan K Ford
(74) *Attorney, Agent, or Firm* — Myers Bigel Sibley & Sajovec, P.A.

(57) ABSTRACT

Provided is a dry etcher including an etching device and a cleaning device, more particularly, a dry etcher including an etching device and a cleaning device to which a cleaning process is added so as to be used in a metal layer etching process. The dry etcher includes an etching device into which etching gas is injected to etch a layer formed on a substrate, a substrate transfer device transferring the substrate processed by the etching device, and a cleaning device cleaning the substrate transferred by the substrate transfer device.

10 Claims, 4 Drawing Sheets

(56) References Cited

OTHER PUBLICATIONS

Office Action from the Chinese Patent Office for the corresponding Chinese patent application No. 200710102093.9, issued Mar. 20, 2009.

Notice of Examination Report from the Korean Intellectual Property Office issued Apr. 28, 2007.

Taiwan Office Action issued May 27, 2011 corresponding to Taiwan Patent Application No. 096124552 and Search Report; 9 pages.

* cited by examiner

DRY ETCHER INCLUDING ETCHING DEVICE AND CLEANING DEVICE

CROSS REFERENCE TO RELATED APPLICATION

This application claims priority from Korean Patent Application No. 10-2006-72327 filed on Jul. 31, 2006 in the Korean Intellectual Property Office, the disclosure of which is incorporated herein by reference in its entirety.

BACKGROUND OF THE INVENTION

1. Field of the Invention

The present invention relates a dry etcher including an etching device and a cleaning device, and more particularly, to a dry etcher including an etching device and a cleaning device to which a cleaning process is added so as to be used in a metal layer etching process.

2. Description of the Related Art

In general, an etching process is a process for removing a layer formed below a photoresist so as to correspond to the photoresist formed on a wafer. A method of etching a wafer includes two methods, that is, wet etching and dry etching.

In wet etching, a wafer is immersed in an etching solution and then etched using a chemical reaction. There is an advantage in that wet etching has excellent selectivity and productivity. However, since wet etching is a chemical etching, undercut may occur on the wafer due to isotropic etching. For this reason, it is difficult to form fine patterns by using the wet etching.

In contrast, in dry etching, gas is perpendicularly collided against the wafer and anisotropic etching is performed due to the perpendicular injection of the gas. As a result, it is possible to form fine patterns by using the dry etching. In addition, since chemical solutions are not used in the dry etching, it is possible to perform etching in a clean and safe manner. For this reason, the dry etching has been widely used in recent years. However, because gas physically collides against the wafer, it is not possible to selectively etch specific materials. That is, there is a disadvantage in that the dry etching has poor selectivity.

Further, when etching gas containing chlorine gas or fluorine gas is used as dry etching gas, a chlorine gas layer or fluorine gas layer is formed on the wafer after the etching process. Each of the gas layers is bonded to steam ($H_2O$), and then generates a hydrochloric acid (HCl) or hydrofluoric acid (HF) which is a strong acid. As a result, metal formed on the wafer is etched.

For this reason, a dry etcher using the etching gas, which contains the chlorine gas or fluorine gas, cannot be used to etch the metal layer in the related art. As a result, the dry etcher in the related art has been commonly used to etch only a nonmetal layer.

SUMMARY OF THE INVENTION

An object of the present invention is to provide a dry etcher in which a cleaning process is added so as to be used in processes for etching a metal layer as well as a nonmetal layer.

Objects of the present invention are not limited to those mentioned above, and other objects of the present invention will be apparent to those skilled in the art through the following description.

According to an aspect of the present invention, there is provided a dry etcher including an etching device into which etching gas is injected so as to etch a layer formed on a substrate, a substrate transfer device transferring the substrate processed by the etching device, and a cleaning device cleaning the substrate transferred by the substrate transfer device.

BRIEF DESCRIPTION OF THE DRAWINGS

The above and other features and advantages of the present invention will become more apparent by describing in detail preferred embodiments thereof with reference to the attached drawings, in which.

DESCRIPTION OF THE PREFERRED EMBODIMENTS

Figure 1:
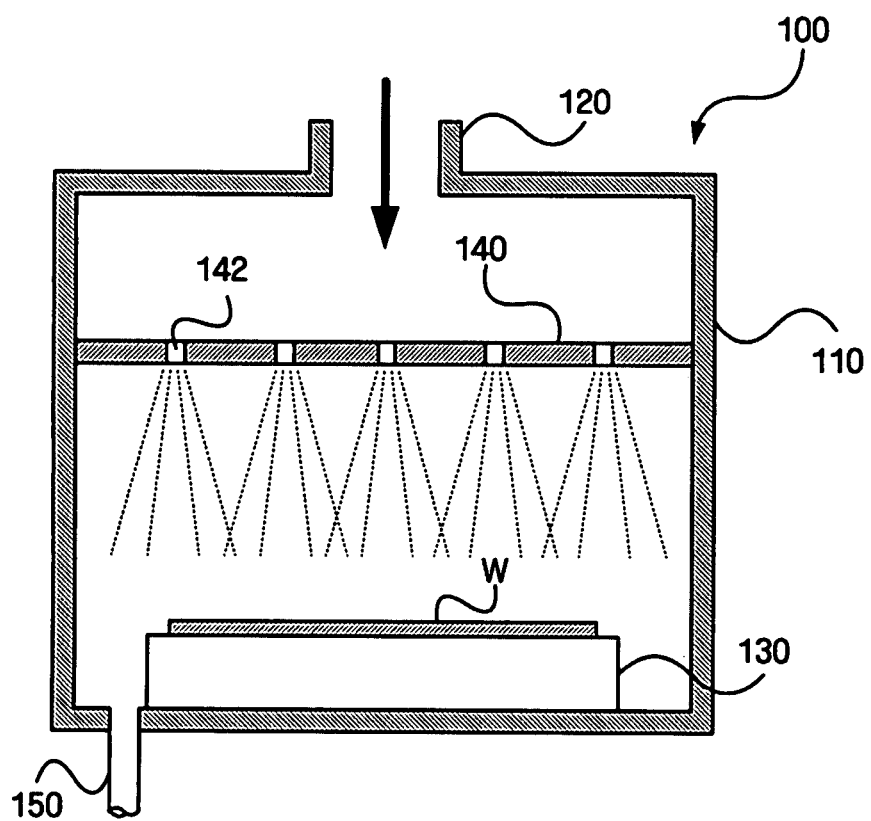
FIG. 1 is a schematic view showing an etching device of a dry etcher, which includes an etching device and a cleaning device, according to an embodiment of the present invention.

Advantages and features of the present invention and methods of accomplishing the same may be understood more readily by reference to the following detailed descriptions of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the present invention to those skilled in the art, and the present invention will only be defined by the appended claims. Like reference numerals refer to like elements throughout the specification.

Hereinafter, a preferred embodiment of the present invention will be described in more detail with reference to accompanying drawings.

Figure 2:
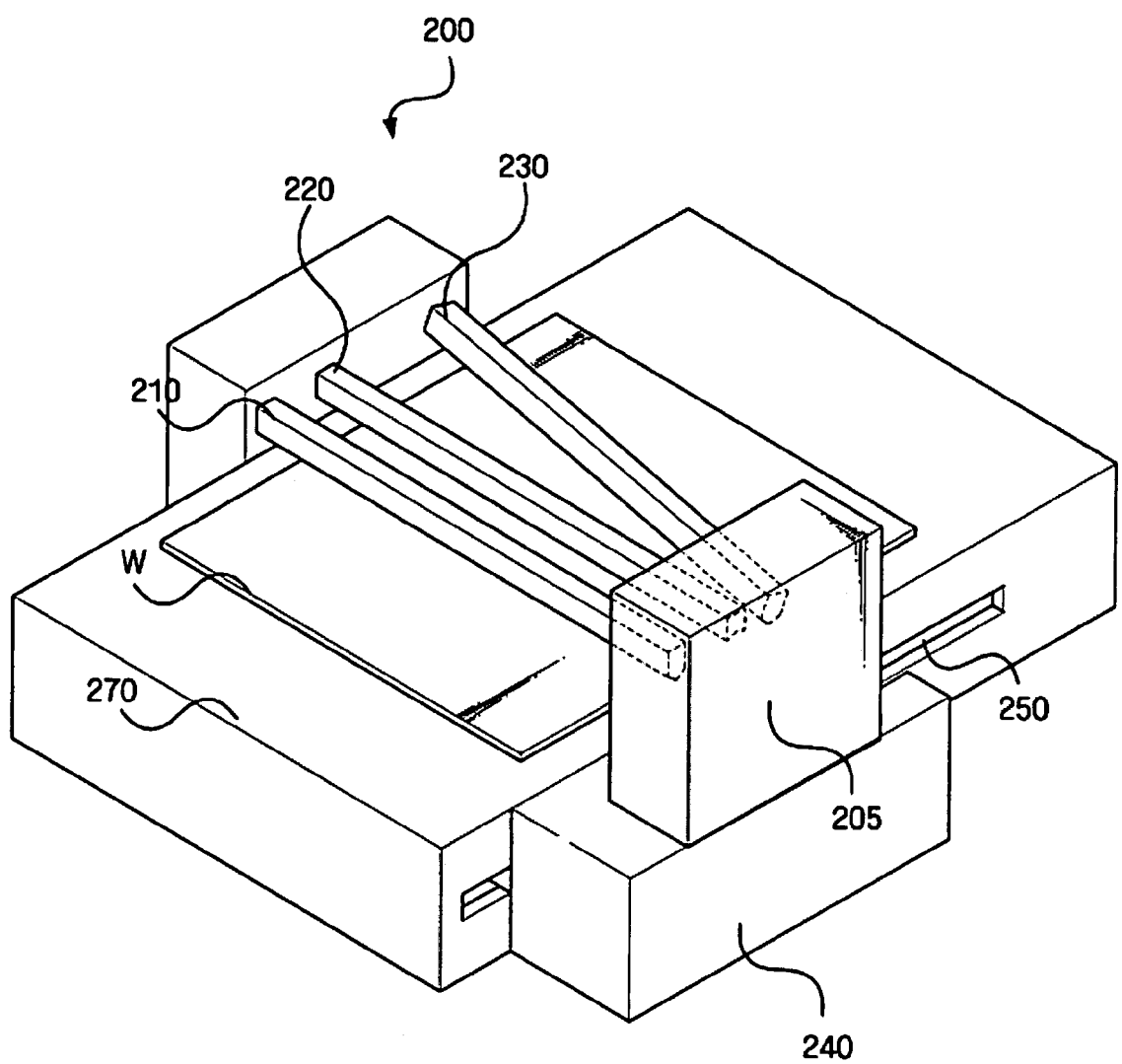
FIG. 2 is a perspective view showing a cleaning device of the dry etcher, which includes the etching device and the cleaning device, according to the embodiment of the present invention.

FIG. 1 is a schematic view showing an etching device of a dry etcher, which includes an etching device and a cleaning device, according to an embodiment of the present invention. FIG. 2 is a perspective view showing a cleaning device of the dry etcher, which includes the etching device and the cleaning device, according to the embodiment of the present invention.

A dry etcher, to which a cleaning process is added, according to an embodiment of the present invention may include an etching device 100, a cleaning device 200, and a substrate transfer device 300.

The etching device 100 shown in FIG. 1 forms patterns on a lower layer, which is formed on a substrate, by using etching gas. The etching device 100 may include an etching chamber 110, a gas inlet 120, a diffuse plate 140, and a substrate mounting unit 130.

The etching chamber 110 provides a space used to etch a substrate W that is placed on the substrate mounting unit 130 provided on the lower side in the etching chamber 110. Etching gas is supplied through the gas inlet 120 to the etching chamber 110 from the outside. The etching chamber 110 may include an outlet 150 through which the residue of the etching process is discharged. Further, the etching chamber 110 may include a diffuse plate 140. The diffuse plate 140 partitions the etching chamber 110 into an upper portion and a lower portion in the etching chamber 110, and a plurality of through holes 142 is formed in the diffuse plate 140 so as to be perpendicular to the surface thereof. Since the substrate is processed in the etching chamber 110, the etching chamber 110 has a cross section larger than the area of the substrate. In addition, the etching chamber 110 may have a wide space therein so as to process an enlarged substrate in recent years.

The substrate mounting unit 130 is provided on the lower side in the etching chamber 110, and may include a mechanical or electronic fixing member for fixing the substrate to the substrate mounting unit 130 during the etching process. The substrate mounting unit 130 may preferably include an electrostatic chuck that controls an electro-static force generated due to the dielectric polarization so as to attach or detach the substrate to or from a dielectric surface.

The gas inlet 120 is used to supply the etching gas to the etching chamber 110 from the outside. The gas inlet 120 is fixed to the upper portion of the etching chamber so that the etching gas supplied from the outside is supplied to the etching chamber 110. A male thread and a female thread, rivets, nuts and bolts, or the like may be used to attach the gas inlet 120 to the etching chamber 110. Further, adhesion, taping-up, welding, or the like, which can be modified by those skilled in the art, may also be used to attach the gas inlet 120 to the etching chamber 110.

The cleaning device 200 shown in FIG. 2 is used to remove the residue and chlorine gas layer remaining on the substrate processed by the etching device 100, by using deionized water. Further, the cleaning device 200 may include a knife unit 210, 220 and 230, a frame 205, a substrate mounting unit 270, and a driving unit 240.

The knife unit 210, 220 and 230 includes one or more knives used in a cleaning process, and may include an in-shower knife 210, a suction knife 220, and an air knife 230.

The in-shower knife 210 injects deionized water, which is used to clean the substrate in the cleaning device 200, onto the substrate. The in-shower knife 210 may have a small cross section of an outlet so as to inject the deionized water onto the substrate at a sufficient drift velocity. The shape of the outlet of the in-shower knife may be modified in various ways in consideration of the adhesiveness of the residue and chlorine gas layer so that the deionized water is injected at a sufficient drift velocity.

For example, as shown in FIG. 2, the end of the outlet of the in-shower knife 210 is opened and the deionized water may be supplied through the open outlet. Alternatively, the outlet of the knife is closed and a plurality of holes is provided in the vicinity of the outlet, so that the deionized water may be supplied through the holes. Alternatively, unlike the shape shown in FIG. 2, the in-shower knife may be provided with a plurality of shower heads (not shown) so that the deionized water is injected through holes of the shower heads.

When the deionized water injected through the in-shower knife does not remain on the substrate and flows thereon, the suction knife 220 can suck the deionized water. Accordingly, the cross section of an inlet, through which the deionized water is sucked, of the suction knife 220 may be larger than that of the outlet of the in-shower knife 210 or air knife 230. However, when the deionized water is sufficiently sucked so as not to flow on the substrate, the knife unit may not include the suction knife or the suction knife may not perform a suction process.

The air knife 230 is used to dry the substrate onto which the deionized water is injected. Accordingly, as shown in FIG. 2, if the air knife 230 is inclined in a predetermined direction and injects gas, the air knife 230 can push the deionized water in a predetermined direction by using the injected gas. Further, if the air knife 230 is inclined upward or downward above the substrate, the air knife 230 can push the deionized water in an upward or downward direction by using the injected gas. Furthermore, if the air knife 230 injects air while the substrate is fed at a predetermined angle, liquid or the deionized water on the substrate is quickly pushed in a predetermined direction. As a result, it is possible to dry the substrate.

As shown in FIG. 2, a plurality of knives may be fixed to the frame 205. For example, the in-shower knife 210, the suction knife 220, the air knife 230 may be sequentially fixed to the frame 205. However, since the air knife is inclined at a predetermined angle in plan view, the air knife may be obliquely fixed to the frame. In addition, considering that the speed in a process and the interference between the knives, it is preferable that the knives be fixed to the frame with a predetermined interval therebetween.

As shown in FIG. 2, if the substrate is stopped and the frame 205 is moved, it is possible to move each of the knives 210, 220, and 230. Accordingly, while being moved, each of the knives can operate so as to correspond to each function thereof. For example, the in-shower knife 210 injects the deionized water onto the substrate so as to remove the residue from the substrate and to remove chlorine from the chlorine gas layer. Further, while being moved, the suction knife 220 can suck the deionized water flowing on the substrate so as to remove the deionized water. Finally, while injecting air so as to push the deionized water on the substrate in a predetermined direction, the air knife 230 can dry the substrate by using the gas flow.

The driving unit moves the frame 205 in a horizontal direction. The frame 205 may be moved on a slide 250 or rails, and the frame 205 may be moved using an electric motor (not shown) or a hydraulic piston (not shown). The driving unit may use chains or may further include position sensors (not shown) to accurately control the position of the frame.

The substrate mounting unit 270 of the cleaning device 200 functions so as to correspond to the substrate mounting unit 130 of the etching device 100. Accordingly, the substrate mounting unit 270 of the cleaning device 200 may include a mechanical or electronic fixing member for fixing the substrate, which is to be processed by the cleaning device, to the substrate mounting unit 270. In addition, the substrate mounting unit 270 may be designed to be movable so as to move the substrate processed by the cleaning device.

Figure 3:
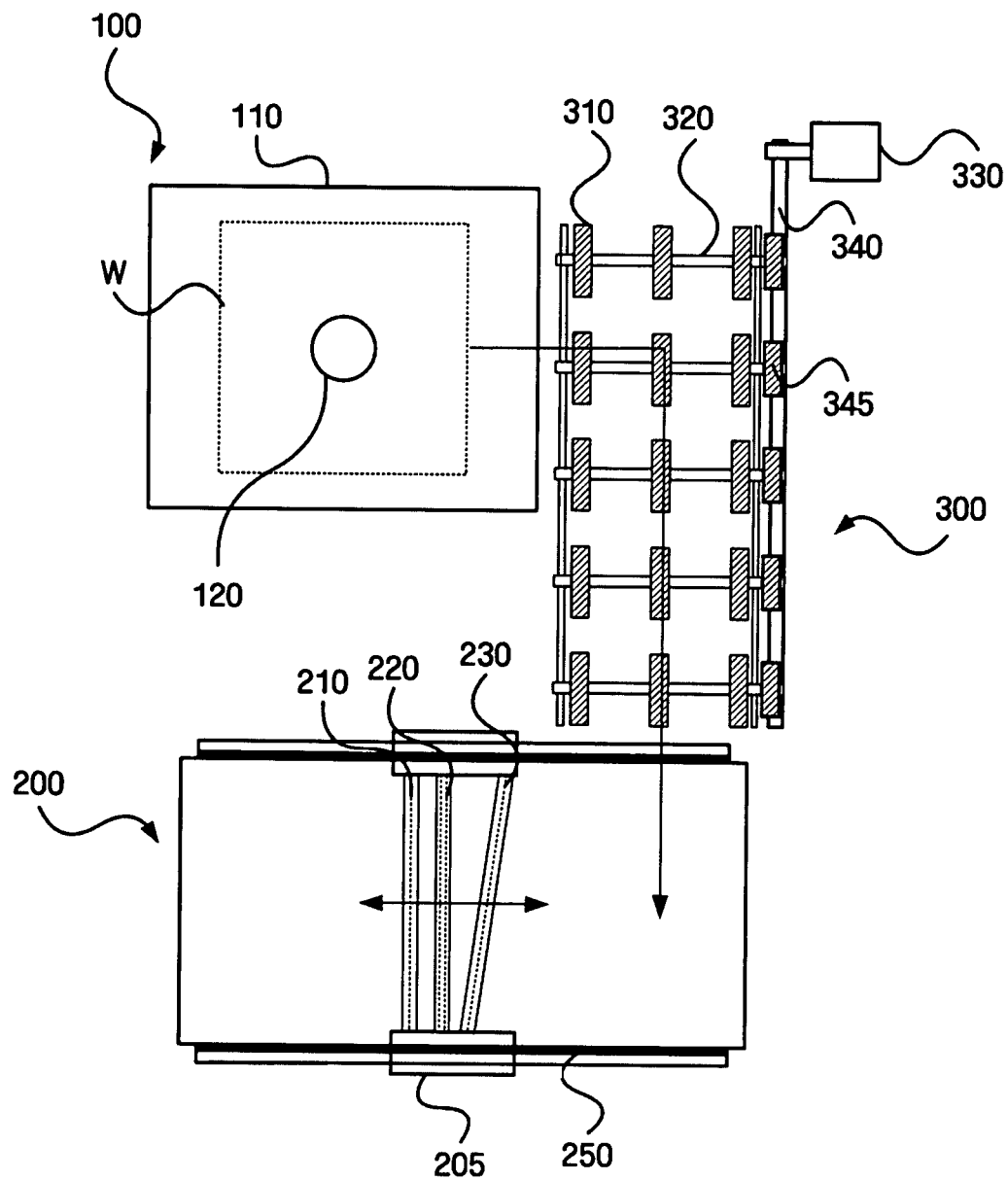
FIG. 3 is a plan view of the dry etcher, which includes the etching device and the cleaning device, according to the embodiment of the present invention.

FIG. 3 is a plan view of the dry etcher, which includes the etching device and the cleaning device, according to the embodiment of the present invention.

The substrate transfer device 300 transfers the substrate from the etching device 100 to the cleaning device 200 after the etching process. For example, the substrate transfer device 300 may include rollers 310 and shafts 320, as shown in FIG. 3. In other words, a plurality of rollers 310 is fixed to one shaft 320 and the shaft is rotated so as to rotate the rollers having a relatively large diameter. As a result, it is possible to feed the substrate. The substrate transfer device 300 may include a plurality of shafts 320 as shown in FIG. 3 to feed the substrate from the etching device 100 to the cleaning device 200. Each of the rollers 345 fixed to the end of each shaft may be rotated using a driving unit 330, which generates torque, such as a driving motor. In this case, the rollers 345 fixed to the ends of the shafts may be connected to each other by using a belt 340 or a chain and may be rotated using one driving unit 330, so as to rotate the shafts at the same rotational speed.

The substrate transfer device 300 may include pulleys (not shown) instead of the rollers connected to the driving unit so as to rotate the shafts at the same rotational speed. In this case, the pulleys may be connected to each other by using a chain and are rotated using the chain. Accordingly, the substrate can be transferred to the cleaning device at the constant speed by using the rollers.

Figure 4:
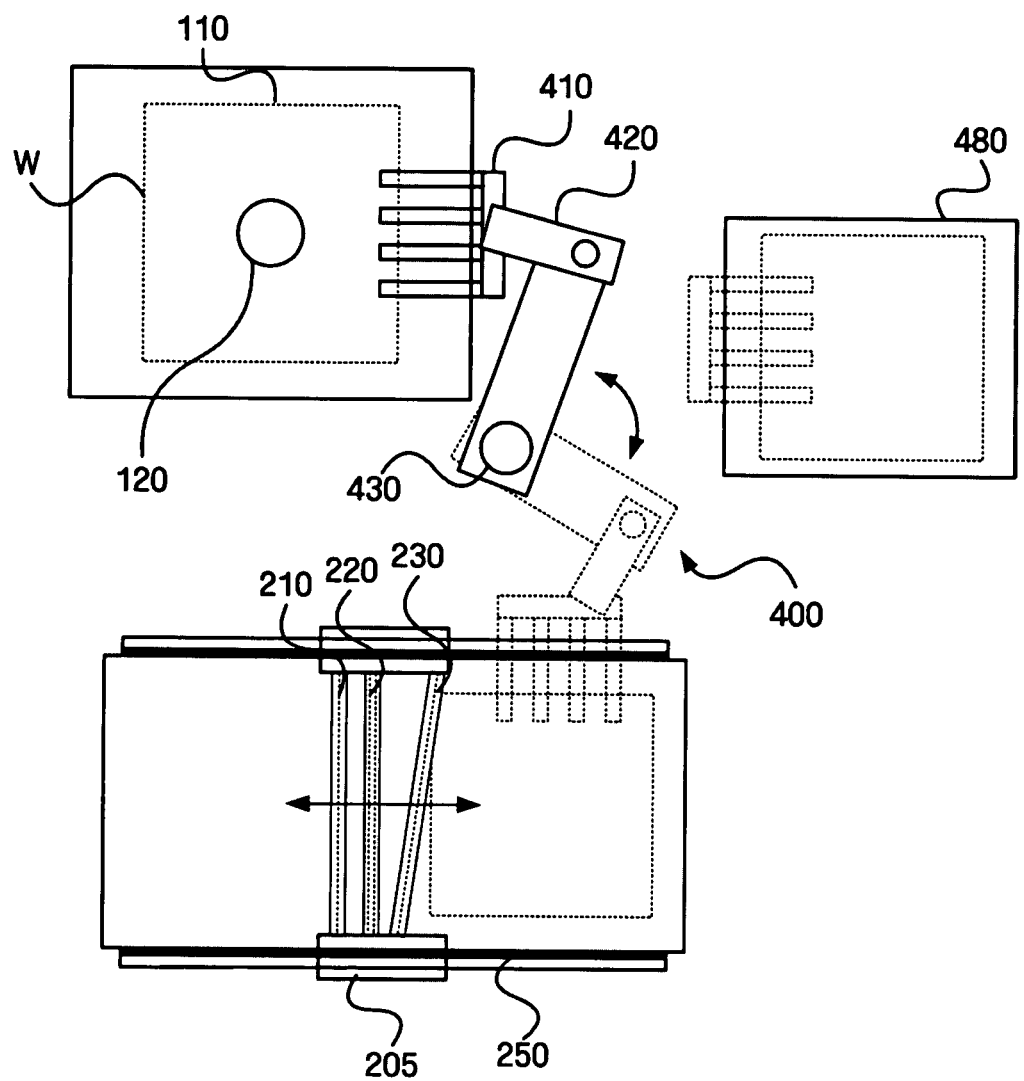
FIG. 4 is a plan view illustrating the operation of a substrate transfer device of the dry etcher, which includes the etching device and the cleaning device, according to the embodiment of the present invention.

FIG. 4 is a plan view illustrating the operation of the substrate transfer device of the dry etcher, which includes the etching device and the cleaning device, according to the embodiment of the present invention.

The substrate transfer device 300 may include an index robot 400. The index robot 400 picks up the substrate with fingers 410 and transfers the substrate to a desired position. The index robot 400 may include one or more rods 420 and one or more shafts 430. In general, two rods and two rotating shafts may be used to pick up the substrate with fingers and to transfer the substrate to a predetermined position on a plane.

Therefore, an index robot, which uses two rods and two rotating shafts, can be used to transfer the substrate from the etching device to the cleaning device on the same plane. Meanwhile, an index robot, which uses two rods and three rotating shafts, can be used to transfer the substrate from the etching device to the cleaning device on different planes. For this reason, since the substrate can be transferred from one point to another point in a space, the index robot can transfer the substrate from the etching device to the cleaning device.

In addition, the dry etcher may include rails (not shown), so that the index robot is moved along a path formed between the etching device and the cleaning device. That is, the index robot can be moved along the path due to the rails. As a result, it is possible to repeatedly transfer the substrate from the etching device to the cleaning device.

When the process is delayed in the cleaning device 200 or a plurality of substrates is processed in the etching device 100, a buffer device 480 may temporarily store the substrates. Accordingly, the buffer device 480 may have a multiple-stage structure so as to store a plurality of substrates. In addition, while the buffer device 480 stores the plurality of substrates, the index robot 400 can select the substrate from the buffer device 480 and transfer the selected substrate to the cleaning device 200 so that the substrate previously stored in the buffer device 480 is preferentially discharged from the buffer device 480.

For this reason, as shown in FIG. 4, when the transfer of the substrate to the cleaning device is delayed, the index robot transfers the substrate from the etching device to the buffer device and temporarily stores the substrate.

The operation of the dry etcher, which uses a first-in first-out method, according to the embodiment of the present invention will be described below.

A lower layer formed below a photoresist is removed so as to correspond to patterns of the photoresist in the etching device 100. Further, in the etching device 100, etching gas containing chlorine or fluorine is injected into the etching chamber 110 through the gas inlet 120. Accordingly, the lower layer made of metal or nonmetal is etched due to the injected etching gas.

For example, when the lower layer made of metal is etched, a chlorine gas layer can remain on the substrate. The chlorine gas layer is bonded to steam ($H_2O$) in the air, and then generates a hydrochloric acid (HCl) which is a strong acid. The generated hydrochloric acid is bonded to a metal layer attached to the substrate, so that patterns formed in the etching process are corroded. For this reason, defects and malfunctions of circuits are caused by the corrosion of the patterns formed on the substrate.

The substrate is transferred from the etching device 100 to the cleaning device 200 after the etching process, and is then cleaned to reduce the above-mentioned corrosion. The substrate transfer device 300 can transfer the processed substrate from the etching device 100 to the cleaning device 200 by using the index robot 400. The index robot 400 picks up the processed substrate and transfers the substrate to the chamber of the cleaning device 200 or the inlet of the cleaning device 200. However, when the process is delayed in the cleaning device 200 or a plurality of substrates is processed in the etching device 100, the processed substrates are transferred to the buffer device 480 by the index robot 400 and are temporarily stored in the buffer device 480.

Alliteratively, the rollers of the substrate transfer device 300 are rotated so as to feed the substrates. According to the substrate transfer device that includes a plurality of shafts 320 and rollers 310, since the driving unit 330 rotates the shafts, the rollers fixed to the shafts are rotated. As a result, the substrates processed by the etching device 100 can be transferred to the cleaning device 200.

The deionized water is injected onto the transferred substrate in the cleaning device 200. The in-shower knife 210 performs the injection of the deionized water. When the deionized water is uniformly injected onto the substrate, the residue formed on the substrate and the chlorine remaining in the chlorine gas layer react to the deionized water. As a result, it is possible to remove the residue and the chlorine. The deionized water may be sufficiently supplied so as to remove the chlorine remaining in the chlorine gas layer.

Further, shower heads (not shown) instead of the in-shower knife 210 may be used to supply the deionized water. The shower heads may include a plurality of through holes at the outlet of a pipe through which the deionized water is injected, so that the deionized water is injected in a radial direction. Accordingly, it is possible to uniformly inject the deionized water onto the substrate.

After the deionized water is injected onto the substrate, the suction knife 220 sucks the deionized water injected onto the substrate. Even though the deionized water is bumped against the substrate and is then scattered in the air, the suction knife 220 can remove the deionized water scattered in the air. For this reason, if the amount of the deionized water scattered in the air is sufficiently small, the suction knife 220 may be not used.

The air knife 230 can dry the substrate onto which the deionized water is injected. The air knife 230 injects air or gas so as to push the deionized water, which is injected onto the substrate, in a predetermined direction. Further, the air knife 230 can dry the substrate by using the convection and heat transfer that are caused by the air flow or gas flow. As a result, it is possible to remove the deionized water remaining on the substrate and to dry the substrate by using the air knife.

The cleaning device 200 may include the frame 205 for transferring the knife unit above the substrate. The frame 205 includes the in-shower knife 210, the suction knife 220, and the air knife 230. Accordingly, the knife unit is fixed to the frame 205 and the frame is transferred, so that it is possible to remove foreign materials and a chlorine gas layer that remain on the substrate.

Although the present invention has been described in connection with the exemplary embodiments of the present invention, it will be apparent to those skilled in the art that various modifications and changes may be made thereto without departing from the scope and spirit of the present invention. Therefore, it should be understood that the above embodiments are not limitative, but illustrative in all aspects.

Since the dry etcher according to the embodiment of the present invention removes the chlorine gas layer remaining on the substrate that is processed in the etching process, it is possible to prevent the corrosion of patterns that are formed on the substrate. Therefore, it is possible to use the dry etcher in the etching process for etching a layer made of metal.

Effects of the present invention are not limited to those mentioned above, and other effects of the present invention will be apparently understood by those skilled in the art through the following claims.

What is claimed is:

1. A dry etcher comprising:
   an etching device comprising an etching chamber into which etching gas is injected so as to etch a layer formed on a substrate within the etching chamber;
   a substrate transfer device configured to transfer the substrate processed by the etching device; and
   a cleaning device comprising a chamber spaced apart from the etching device chamber, wherein the cleaning device is configured to clean the substrate transferred by the substrate transfer device, wherein the cleaning device comprises an in-shower knife configured to inject deionized water onto the transferred substrate, and an air knife configured to inject gas so as to dry the transferred substrate, wherein the air knife is inclined horizontally relative to the in-shower knife and is inclined vertically relative to the substrate, wherein the in-shower knife and the air knife are fixed to a single movable frame with a predetermined interval between the in-shower knife and the air knife, and wherein the in-shower knife can inject deionized water and the air knife can inject gas when the frame is stationary and when the frame is moved.

2. The dry etcher of claim 1, wherein the etching gas contains chlorine or fluorine.

3. The dry etcher of claim 1, wherein the layer formed on the substrate is made of a metal.

4. The dry etcher of claim 1, wherein the etching device comprises an inlet through which the etching gas is injected, and wherein the etching chamber provides a space used to perform an etching process in which the etching gas injected through the inlet is used.

5. The dry etcher of claim 4, wherein the etching device further comprises a diffuse plate provided with a plurality of through holes so that the etching gas injected through the inlet is diffused in the etching chamber.

6. The dry etcher of claim 1, wherein the cleaning device further comprises a suction knife for suction.

7. The dry etcher of claim 6, wherein the suction knife is fixed to the movable frame and can operate when the frame is stationary and when the frame is moved.

8. The dry etcher of claim 1, wherein the substrate transfer device feeds the substrate processed in the etching device by using the rotation of rollers that are fixed to a plurality of shafts.

9. The dry etcher of claim 1, wherein the substrate transfer device transfers the substrate from the etching device to the cleaning device by using an index robot, the index robot comprising fingers picking up the substrate, a plurality of rods supporting the fingers, and shafts rotating the rods.

10. The dry etcher of claim 1, further comprising a buffer device temporarily storing the substrate processed by the etching device prior to transfer to the cleaning device.

* * * * *